(12) United States Patent
De Crecy et al.

(10) Patent No.: US 10,320,097 B2
(45) Date of Patent: Jun. 11, 2019

(54) ELECTRICAL CONNECTORS HAVING A BENT MAIN BODY FOR ELECTRICAL CONNECTION BETWEEN A HOUSING AND A SUPPORT, AND BEING DISPOSED AS A GRID ARRAY OR NETWORK

(71) Applicant: COMMISSARIAT A L'ENERGIE ATOMIQUE ET AUX ENERGIES ALTERNATIVES, Paris (FR)

(72) Inventors: Francois De Crecy, Seyssins (FR); Bernard Diem, Echirolles (FR); Christine Ferrandon, Sassenage (FR); Thierry Hilt, Barraux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/501,686

(22) PCT Filed: Aug. 5, 2015

(86) PCT No.: PCT/EP2015/068073
§ 371 (c)(1),
(2) Date: Feb. 3, 2017

(87) PCT Pub. No.: WO2016/020445
PCT Pub. Date: Feb. 11, 2016

(65) Prior Publication Data
US 2017/0222340 A1     Aug. 3, 2017

(30) Foreign Application Priority Data
Aug. 8, 2014   (FR) ..................... 14 57692

(51) Int. Cl.
*H01R 12/52*   (2011.01)
*H01R 13/24*   (2006.01)
(Continued)

(52) U.S. Cl.
CPC ............. *H01R 12/52* (2013.01); *H01L 24/67* (2013.01); *H01R 13/2435* (2013.01); *H01R 43/16* (2013.01); *H01L 2224/67* (2013.01)

(58) Field of Classification Search
None
See application file for complete search history.

(56) References Cited

U.S. PATENT DOCUMENTS

| 2,740,097 A | 3/1956 | Edelman et al. |
| 4,827,611 A | 5/1989 | Pai et al. |

(Continued)

FOREIGN PATENT DOCUMENTS

| EP | 2 381 538 A1 | 10/2011 |
| EP | 2 557 634 A1 | 2/2013 |
| WO | 93/07657 A1 | 4/1993 |

OTHER PUBLICATIONS

U.S. Appl. No. 14/978,965, filed Dec. 22, 2015, US 2016-0195893 A1, Thierry Hilt.

(Continued)

*Primary Examiner* — Bilkis Jahan
(74) *Attorney, Agent, or Firm* — Oblon, McClelland, Maier & Neustadt, L.L.P.

(57) ABSTRACT

An electrical connector allowing a connection between two substantially facing electrical contacts respectively pertaining to a housing and a support, and including a main body including a first end for secure connection thereof to the housing and a second end for secure connection thereof to the support, the main body being bent in at least one bending area.

21 Claims, 6 Drawing Sheets

(51) Int. Cl.
*H01R 43/16* (2006.01)
*H01L 23/00* (2006.01)

(56) References Cited

U.S. PATENT DOCUMENTS

| | | | |
|---|---|---|---|
| 5,184,962 A | 2/1993 | Noschese | |
| 5,294,039 A | 3/1994 | Pai et al. | |
| 5,317,479 A | 5/1994 | Pai et al. | |
| 5,348,686 A * | 9/1994 | Vyas | C08K 13/04 |
| | | | 252/512 |
| 5,984,692 A | 11/1999 | Kumagai et al. | |
| 6,116,921 A * | 9/2000 | Scholz | H01R 12/57 |
| | | | 439/83 |
| 6,280,224 B1 * | 8/2001 | Huang | H01R 13/193 |
| | | | 439/342 |
| 6,530,798 B1 * | 3/2003 | Li | H05K 7/1007 |
| | | | 439/342 |
| 6,948,949 B1 | 9/2005 | Schwartz | H01R 9/2491 |
| | | | 439/638 |
| 7,422,447 B2 * | 9/2008 | Daily | H01R 43/0256 |
| | | | 439/83 |
| 7,445,460 B1 * | 11/2008 | Fan | H01R 13/40 |
| | | | 439/66 |
| 7,572,053 B2 | 8/2009 | De Crecy et al. | |
| 7,790,615 B2 | 9/2010 | Diem | |
| 7,985,632 B2 | 7/2011 | Barbe et al. | |
| 8,236,698 B2 | 8/2012 | Barbe et al. | |
| 8,349,660 B2 | 1/2013 | Delapierre et al. | |
| 8,367,929 B2 | 2/2013 | Baillin et al. | |
| 8,912,620 B2 | 12/2014 | Ferrandon et al. | |
| 8,981,544 B2 | 3/2015 | Baillin et al. | |
| 9,187,320 B2 | 11/2015 | Diem | |
| 9,277,656 B2 | 3/2016 | Giroud et al. | |
| 9,448,070 B2 | 9/2016 | Walther et al. | |
| 9,511,991 B2 | 12/2016 | Baillin et al. | |
| 9,528,895 B2 | 12/2016 | Robert et al. | |
| 2001/0020545 A1 | 9/2001 | Eldridge et al. | |
| 2002/0092164 A1 * | 7/2002 | Guerin | H01R 43/16 |
| | | | 29/884 |
| 2011/0284263 A1 | 11/2011 | Yumi | |
| 2013/0040510 A1 | 2/2013 | Ishizuka et al. | |
| 2013/0211776 A1 * | 8/2013 | Grivna | H01L 23/49816 |
| | | | 702/150 |

OTHER PUBLICATIONS

International Search Report dated Oct. 5, 2015 in PCT/EP2015/068073 filed Aug. 5, 2015.
French Search Report dated Mar. 27, 2015 in FR 1457692 filed Aug. 8, 2014.

* cited by examiner

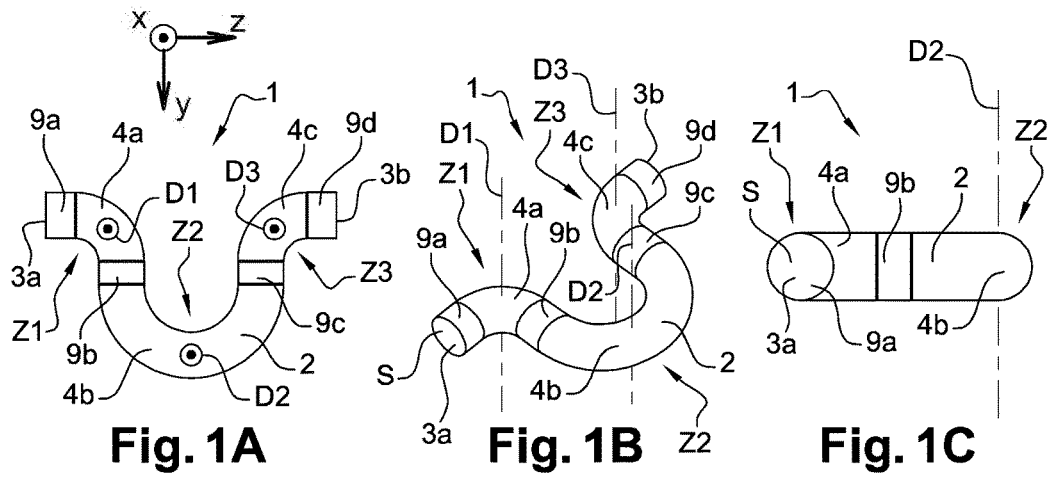
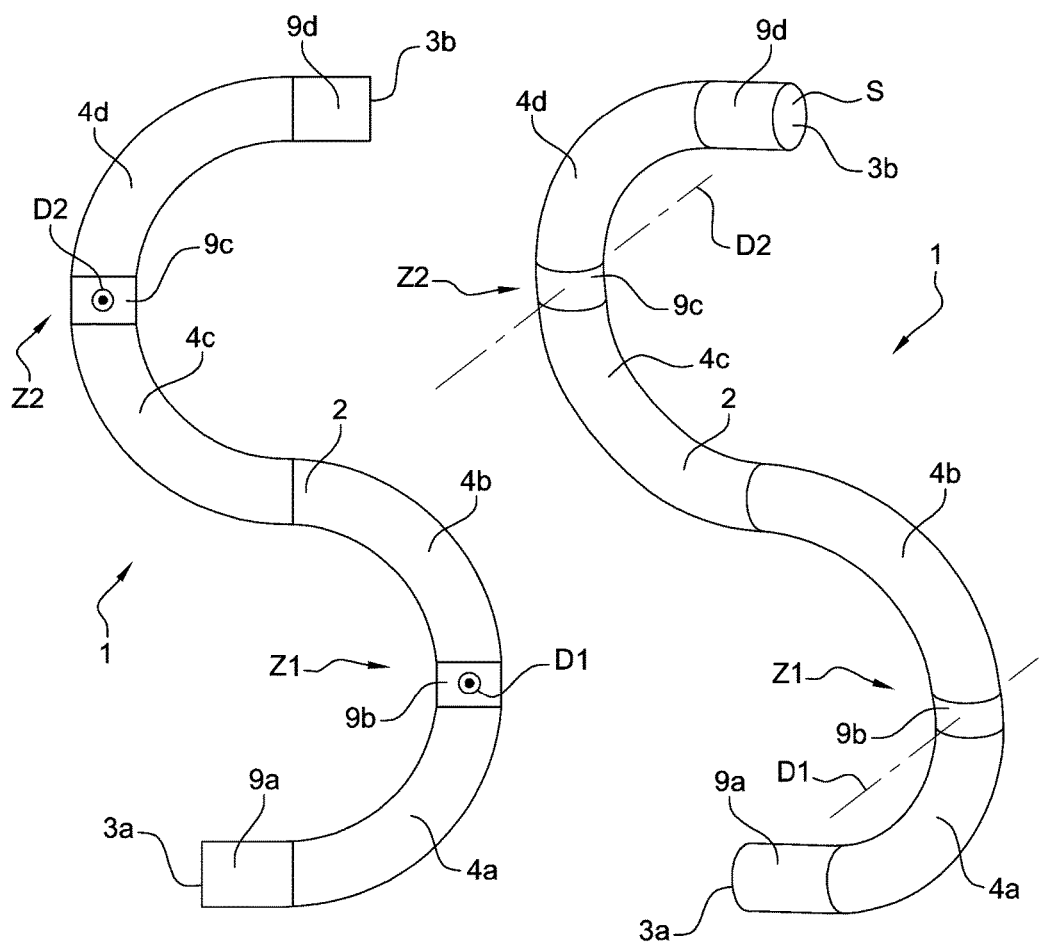

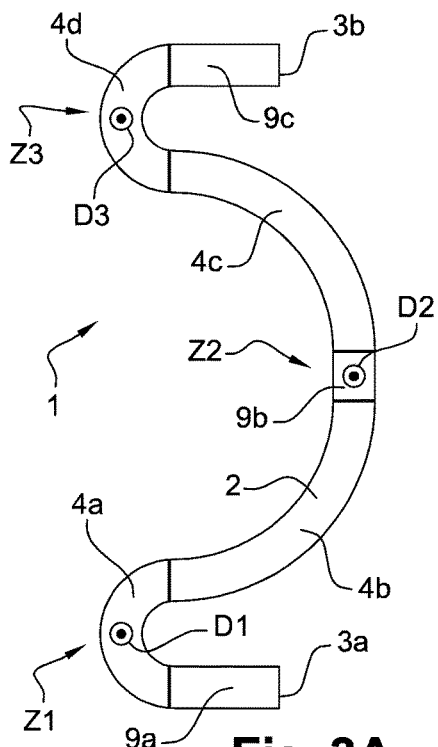
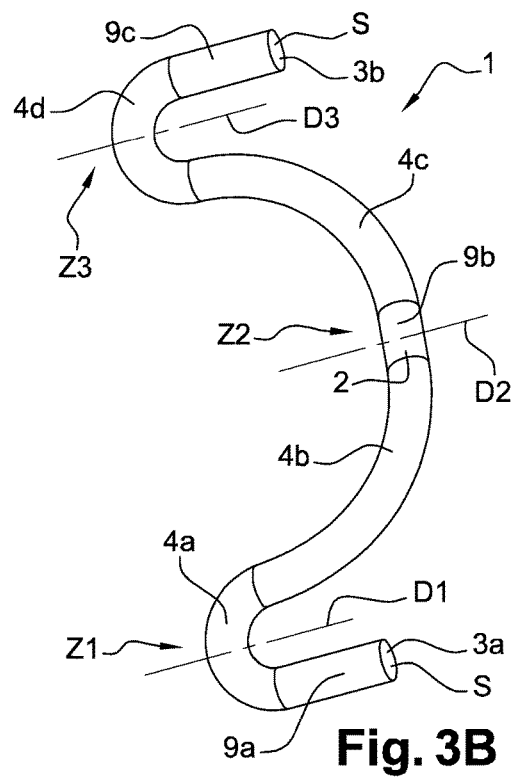
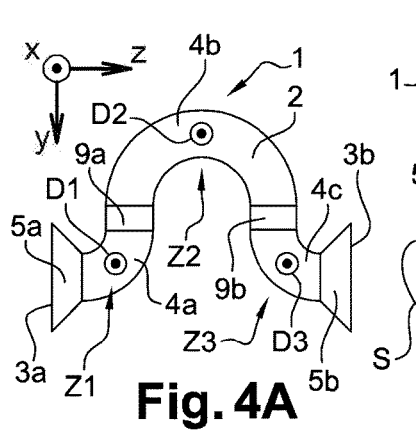
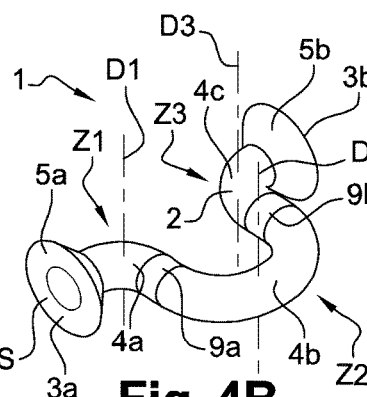
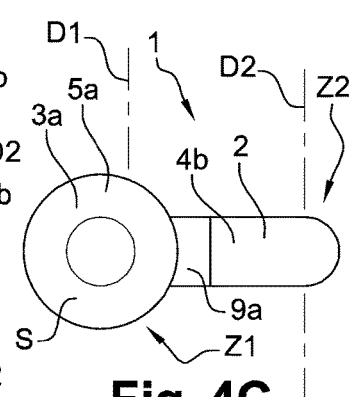

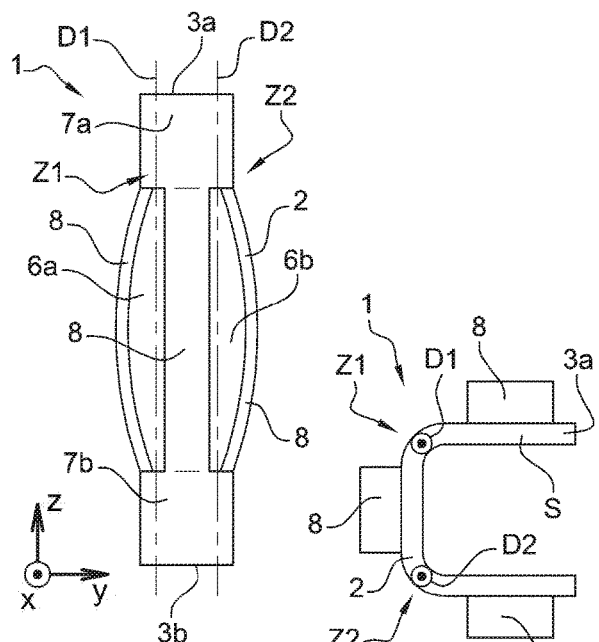
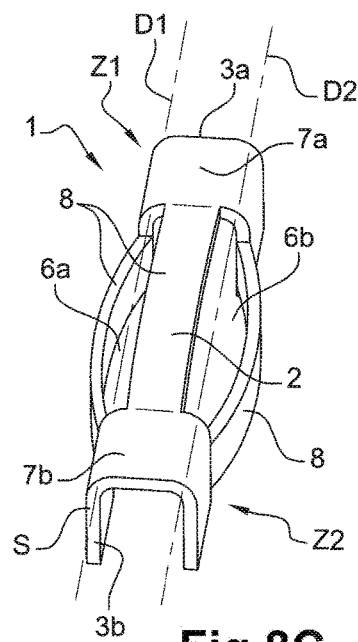
Fig.8A  Fig.8B  Fig.8C
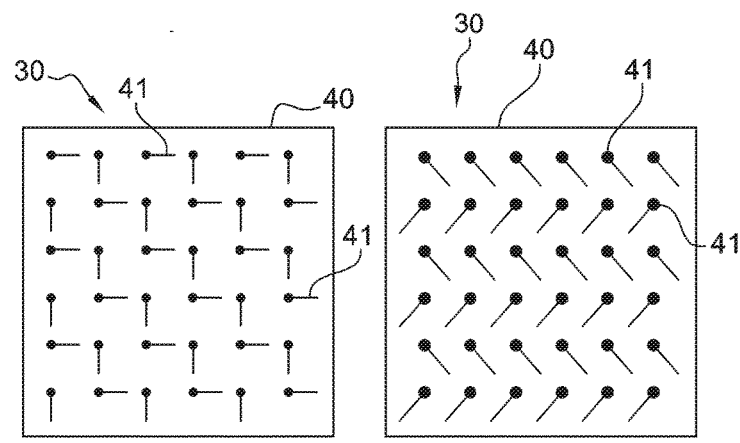
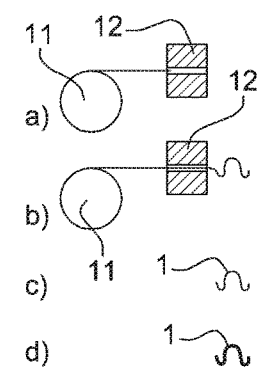
Fig.9A  Fig.9B  Fig.10

ELECTRICAL CONNECTORS HAVING A BENT MAIN BODY FOR ELECTRICAL CONNECTION BETWEEN A HOUSING AND A SUPPORT, AND BEING DISPOSED AS A GRID ARRAY OR NETWORK

TECHNICAL FIELD

The present invention relates to the general field of connector technology, in particular for microelectronics, and more specifically to the field of mechanical and electrical connection means between a package, which is in particular microelectronic can be of a relatively great dimension, and a support, which is in particular microelectronic and can be for example a printed circuit board. Specifically, the invention is concerned with such connection means provided to withstand mechanical deformations without degrading their functions.

The invention finds for example favoured applications in the fields of computer science, telephony, avionics, spatial electronics and automotive electronics, so-called airborne electronics, as well as for most of nomadic electronic objects, among other things.

It thus provides a connector for a grid array connection between a package and a support, a device including a plurality of such connectors arranged as a grid array, as well as a method for manufacturing such a connector. The grid array connection corresponds to a network of connections, in particular between substantially facing or superimposed contacts.

STATE OF PRIOR ART

In the general field of microelectronics, interposers (which enable several electronic components to be assembled side by side), for example comprised of silicon or glass, and integrated circuit packages (which form a mechanical interface between one or more electronic components and the printed circuit), for example comprised of plastics or preferentially ceramics, are increasingly used to enable in particular several microelectronic chips having for example different technologies, designs or providers to be integrated.

Throughout the description, for the sake of simplicity and clarity, by the phrase "microelectronic package", it is meant any microelectronic device that has to be bonded onto a microelectronic support, in particular a printed circuit. In particular, such a device can be an integrated circuit package, in particular a ceramic package, an interposer, for example a silicon interposer, or even a microelectronic chip, in particular of a great dimension, among other things.

In order to ensure bonding of a package to a microelectronic support, in particular to a printed circuit, hundreds or even thousands connections have to be provided. Hence, the connection through the periphery of the package becomes difficult, or even impossible, and it is generally preferred a connection through a grid array (possibly incomplete), that is an array or a grid, of connectors placed on most of one of the faces of the package.

These connectors have to provide multiple functions by connecting the package and the microelectronic support.

First, electrical functions, ensuring the electrical contact regardless of the environment (temperatures, vibration, impacts) with resistance, inductance and electrical capacitance requirements which depend on the application. Part of these requirements can be quantified in terms of electrical resistance, inductance and electrical capacitance of each connector.

Also, mechanical functions, by keeping the package in connection with the microelectronic support, by resisting differential expansions between both these elements, and by withstanding impacts and vibration. The mechanical requirements (amplitude of thermal cycles, intensity of impacts, frequency and acceleration of vibration) depend on the application and can at least partly be expressed by the stiffness of each connector, in the plane of the microelectronic support and the package, or perpendicularly to this plane.

Then, thermal functions, by providing removal to the microelectronic support of all or part of the heat produced by the component(s), for example microelectronic chips, present on the package. The thermal requirements also depend on the application and can at least partly be expressed by the thermal resistance (or the thermal conductance) of each connector.

Finally, the connectors have also functions for making up for flatness defects of the package and the microelectronic support, and non-coplanarity defects between the package and the microelectronic support.

In order to meet the abovementioned needs, it is traditionally known to use the so-called flip chip technique. This technique consists in providing, on the package, a (possibly incomplete) grid array of generally circular electrical contacts (lands), this grid array being also called a land grid array (LGA) for ceramic packages. On these lands, typically of a diameter between 100 and 800 µm, balls are positioned, which are of a relatively low melting point metal, for example selected from eutectics or brazes or solders based on lead, tin, copper, silver, indium, bismuth or other elements. On the other hand, on the microelectronic support, corresponding contacts are also provided facing the same. The package is then flipped onto the microelectronic support, and the whole is brought to the melting temperature of the metal balls, and then is lowered back in temperature. These balls ensure electrical, mechanical and thermal connections between the package and the microelectronic support. For convenient handling and attachment of the ball array to the package, regardless of whether it is a first installation or for a complete repair of the ball grid array, water-soluble performs including balls with desired diameters and pitches, can be found, such as those produced by Winslow Automation, Inc.

However, the drawback with using such metal balls is generally that they are not able to withstand great side differential movements between the package and the microelectronic support, without degrading their mechanical and/or electrical functions. These great side differential movements can be due to thermal expansion differences, impacts or vibration.

Therefore, another solution from prior art consists in replacing the metal balls by metal columns of a relatively plastic or viscoplastic material. It is referred in particular to a column grid array, CGA. These metal columns have the advantage of withstanding a bit better differential expansions with respect to the metal balls. In addition, it is also possible to add to each metal column an inner or outer structure (generally a spiral) of another more elastic metal, for example copper or copper-beryllium, intended on the one hand to preserve the electrical contact even if the mechanical function fails due to a strong plastic deformation of the column, and on the other hand to mechanically reinforce the column.

However, the drawbacks of these metal columns are that they have a high manufacturing cost and they are complicated to produce, in particular in case of the presence of an inner or outer structure, or to be installed to the package. Moreover, the amplitude of the side movements (due to the differential expansions between the package and the microelectronic support) they can withstand without being deteriorated is limited, even if higher than that achieved with the metal balls. Furthermore, to make up for possible height differences between columns after assembling to the package (due in particular to non-flatness defects of the package non-flatness, column length and brazing or soldering), a manual adjustment step has to be implemented. This manual step, as well as all the related handlings, are delicate because of the plasticity of the columns which are deformed whatever the blow is.

Another embodiment of prior art has further been proposed, which consists in replacing the metal balls by copper-beryllium springs, such as those with three spires, plus two joined spires at each end, investigated by NASA. If these springs enable very strong amplitude impacts to be withstood, however they have too high an inductance, induce too much insertion losses and cannot be used for high frequency signals, for example in the order of 10 GHz. Furthermore, their thermomechanical strength (reliability in thermal cycles) has only been shown for reduced dimension packages, mainly in the order of 22 mm side. On the other hand, there are impractical to assemble to the package and to the microelectronic support, since the spires at the ends are not coplanar. Furthermore, the brazed or soldered surface parallel to the plane of the package is a circle, thus reduced in comparison with a solid surface such as a disk.

On the other hand, U.S. Pat. No. 6,215,670 B1 provides wire interconnections comprising at least one direction change and being comprised of at least two materials, one internally and the other externally. These are made on an assembly substrate or a semi-conductor chip, one by one by gold wire thermocompression, and then surface treatment.

Furthermore, US patent application 2013/0344718 A1 provides a substrate having connections folded and brazed or soldered to the substrate, the folding ensuring an elasticity only in the vertical axis. The substrate is not attached to the package by the connections, but is used as an interposer between an electronic board and a package. In this structure type, the connection is of the fixed/free, and not fixed/fixed or embedded/embedded type as according to the invention.

On the other hand, it is known, for example from document entitled "Effect of solder volume on reliability in shape-designed CuCGA interconnect", C. Tian and al, 6th International Forum on Strategic Technology (IFOST), Volume 1, 22-24 Aug. 2011, pages 173-176, that to have a good mechanical reliability, it is clearly preferable to maximise the periphery of the contact surface between the connector and the package or the microelectronic support. Indeed, it is at this contact surface that the braze or solder holds the connector onto the package or the microelectronic support. Various calculations set out in this document, or even in the document entitled "Solder joint fatigue model for large silicon interposers", C. Ferrandon and al, Microelectronics Packaging Conference (EMPC), 9-12 Sep. 2013, pages 1-6, allowed to show that it is in this periphery of the contact surface that the brazing or soldering fatigue is maximum, and thus that the deterioration risks are the highest, in particular if the length of this periphery is low.

DISCLOSURE OF THE INVENTION

Consequently, there is a need for providing an alternative solution of a connector being advantageously flexible between a package and a support, in particular a printed circuit, such a connector being in particular of a simple design and robust, of a moderate cost, readily calculatable, and able to meet electrical, mechanical and thermal functions assigned thereto as well as compensate for non-flatness or non-coplanarity defects of the package and/or the support.

Thus, the purpose of the invention is to overcome at least partially the abovementioned needs and the drawbacks relating to embodiments of prior art.

Thus, one object of the invention, according to one of its aspects, is an electrical connector, intended to allow a connection between two substantially facing electrical contacts of a package and a support respectively, characterised in that it includes a main body provided with a first end for being fixedly connected to the package and a second end for being fixedly connected to the support, the main body being folded at least one folding zone, or even at least two folding zones, or even at least three folding zones, or even at least four, or even five folding zones.

By virtue of the invention, it s possible to provide a new connector type meeting the above-discussed needs and requirements. In addition, it is worth of note that the connector according to the invention can enable a great dimension package to be connected to the support which is in particular microelectronic. Indeed, with the principle of the connector according to the invention, it is possible to achieve both the desired, even relatively low, stiffness, of the connector in the direction of the plane of the support or of the package and a relatively large displacement, for example of about one hundred microns or more, between top and bottom of the connector in the direction of the plane of the support or the package. Thereby, it can be possible to dimension the connector to adjust independently stiffnesses in the directions normal and parallel to the package and the support.

The connector according to the invention can further include one or more of the following characteristics taken alone or according to any technically possible combinations.

The support preferentially consists of a printed circuit. The package can in turn be most particularly a ceramic package or a silicon interposer, in particular of a great dimension.

Said at least one folding zone can more specifically include at least one folding direction or line.

The main body of the connector can include a wire, a strip or a plate, for example a metal sheet, in particular of metal material.

Furthermore, the main body of the connector can be elastic.

According to one alternative, the main body can be folded along at least one, or even two folding directions. In the case of a main body including a wire, said at least two folding directions can induce at least two arcuate or circular portions defining a wavy shape together.

The wire can preferentially have a circular cross-sectional shape. However, other shapes are possible.

Furthermore, the main body can be a wire folded along two folding directions, defining in particular an "S"-like shape.

Alternatively, the main body can be a wire folded along three folding directions, defining in particular a "Ω"-like shape.

Each of the first and second ends of the main body can have a circular connection area, respectively for the connection to the package and to the support.

On the other hand, each of the first and second ends of the main body can include a conical or enlarged tip. Each of the first and second ends of the main body can in particular have a connection area being circular or enlarged with respect to the main body, in other words greater than the cross-section of the main body, respectively for the connection to the package and to the support.

According to a second alternative, the main body can be a strip, folded along at least one, or even two folding directions.

The strip can have, before folding, a substantially rectangular shape.

Each of the first and second ends of the main body can have a rectangular or square connection area.

Furthermore, the main body can be a strip folded along a first folding direction at the first end and along a second folding direction at the second end, the first and second folding directions being orthogonal. The main part of the main body can furthermore be advantageously twisted, in particular at an angle in the order of 90°, or the centre part of the main body can be folded along a 45° direction from the first and second folding directions.

Alternatively, the main body can be a strip folded along first and second folding directions at the first end, and along third and fourth folding directions at the second end, the first and second folding directions being parallel to each other and orthogonal to the third and fourth folding directions, the third and fourth folding directions being parallel to each other. The centre part of the main body can furthermore be advantageously twisted in particular at an angle in the order of 90° or the centre part of the main body can be folded along a 45° direction from the first, second, third and fourth folding directions.

According to a third alternative, the main body can be a plate, in particular a metal sheet, folded along at least one, or even two folding directions.

The main body can then include cut-outs formed between tabs connecting upper and lower parts, including the first and second ends respectively.

Each of the first and second ends of the main body can have a connection area having a "U"-like shape.

On the other hand, the purpose of the invention, according to another of its aspects, is also to provide a device which is in particular microelectronic, characterised in that it includes a plurality of connectors such as previously defined, disposed on a surface of the device according to a grid array or network, the device corresponding to one of the elements selected from the package and the support, and the connectors allowing said element to be connected as a grid array or network with the other of the elements selected from the package and the support.

Thus, the device can correspond to the package or to the support.

The plurality of connectors can include a general direction orthogonal to the device, the different connectors being disposed along this direction with different orientations, in particular at 90°, and advantageously alternate. In particular, the electrical connectors can be disposed along rows of connectors substantially parallel to each other, the orientations of the connectors of each row alternating two by two.

Advantageously, the arrangement of the electrical connectors along a same general direction orthogonal to the device, with different orientations, enables stresses (or deformations) applied to the device to be managed. In particular, the different orientations of these connectors can be applied between adjacent connectors so as to create an overall isotropic stress in the device: the rigidity along the axis x of a first connector is equal to the rigidity along the axis y of a second connector, adjacent to the first connector and oriented at 90° and the rigidity along the axis y of the first connector is equal to the rigidity along the axis x of the second connector. Thus, the overall rigidity of both these connectors is identical along the axes x and y, enabling an overall isotropic behaviour of the device to be achieved.

Furthermore, the device can include a grid array base-forming element wherein a plurality of cavities is formed according to the desired shape of the grid array or network of the connectors, the cavities accommodating the connectors for being attached in particular by brazing or soldering to the device.

The grid array base-forming element can in particular include a soluble material.

In an alternative, the grid array base-forming element can be removable, and in particular intended to be withdrawn after the connectors have been fixed on the package and/or the support by brazing or soldering.

In addition, the cavities of the grid array base-forming element can be formed with different orientations along at least two different directions, in particular alternately, for example along two perpendicular directions of the plane of the package.

Furthermore, the purpose of the invention, according to another of its aspects, is also to provide a method for manufacturing a connector such as defined previously, wherein, from a conductive material conditioned as a sheet or coil, shaping by folding, cutting-out and surface treatment operations for attachment in particular by brazing or soldering are performed, to obtain the connector.

The method can be implemented for manufacturing a connector according to the first and second alternatives previously set out, and can include the steps, successive or not, of:
  introducing a wire or strip coil within a treatment machine,
  shaping by folding the wire or strip through the treatment machine,
  cutting-out the wire or strip,
  optionally performing a surface treatment of the wire or strip, this surface treatment having in particular the purpose to passivate the connector and to make it compatible for brazing or soldering.

The method can also be implemented for manufacturing a connector according to the third alternative previously set out, and can include the steps of:
  machining a sheet or coil by means of a press and a progressive die to cut it out,
  shaping by folding the sheet or coil,
  optionally performing a surface treatment of the sheet or coil, this surface treatment having in particular the purpose to passivate the connector and to make it compatible for brazing or soldering.

The connector, the device and the manufacturing method according to the invention can include any of the characteristics set forth in the present description, taken alone or according to any technically possible combinations with other characteristics.

BRIEF DESCRIPTION OF THE DRAWINGS

The invention will be better understood upon reading the detailed description that follows, of exemplary implementations not limiting the same, as well as upon examining schematic and partial figures, of the appended drawing, in which:

FIGS. 1A, 1B and 1C represent a side view, a perspective view and a top or bottom view respectively of a first exemplary embodiment of a connector in accordance with the invention, FIGS. 2A and 2B represent a side view and a perspective view respectively of a second exemplary embodiment of a connector in accordance with the invention, FIGS. 3A and 3B represent a side view and a perspective view respectively of a third exemplary embodiment of a connector in accordance with the invention, FIGS. 4A, 4B and 4C represent a side view, a perspective view and a top or bottom view respectively of a fourth exemplary embodiment of a connector in accordance with the invention, FIGS. 8A, 8B and 8C represent a side view, a top or bottom view and a perspective view respectively of an eighth exemplary embodiment of a connector in accordance with the invention, FIGS. 9A and 9B represent a top view respectively of two exemplary grid array base-forming elements for a microelectronic device including a plurality of connectors in accordance with the invention arranged as a grid array, FIG. 10 illustrates four steps of a method for manufacturing a connector in accordance with the invention.

Figure 5A:
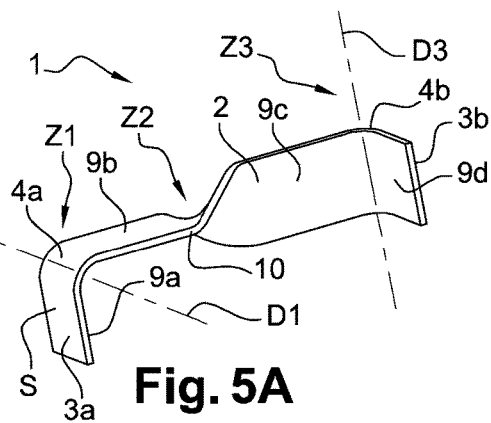
FIGS. 5A, 5B and 5C represent a perspective view, a side view and a top or bottom view respectively of a fifth exemplary embodiment of a connector in accordance with the invention.

Throughout these figures, identical references can designate identical or analogous elements.

In addition, the different parts represented in the figure are not necessarily drawn to a uniform scale, for making the figures more legible.

DETAILED DISCLOSURE OF PARTICULAR EMBODIMENTS

In reference to FIG. 1A to 8C, eight exemplary embodiments of connectors 1 in accordance with the invention have, been represented. Such connectors 1 are in particular intended to allow a microelectronic package and a microelectronic support, and in particular a printed circuit to be connected as a grid array.

According to a first alternative in reference to FIG. 1A to 4C, the connectors 1 can be in the form of folded metal wires.

According to a second alternative in reference to FIG. 5A to 7C, the connectors 1 can be in the form of folded metal strips.

Finally, according to a third alternative in reference to FIG. 8A to 8C, the connector 1 can be in the form of a plate, and in particular in the form of a folded metal sheet.

In all these exemplary embodiments of connectors 1 in accordance with the invention in reference to FIG. 1A to 8C, each connector 1 includes a main body 2 provided with a first end 3a for being connected with the microelectronic package and a second end 3b for being connected with the microelectronic support. In accordance with the invention, the main body 2 is folded at least two folding zones Z1-Z5, which include in particular at least two folding directions D1-D5.

First, in reference to FIG. 1A to 1C, a first exemplary embodiment of a connector 1 in accordance with the invention is represented in a side view, a perspective view and a top or bottom view respectively.

In this first example, the main body 2 is a wire folded along three folding directions D1, D2 and D3 so as to define a "Ω"-like shape. It includes three circular portions 4a, 4b and 4c at least two of which define a wavy shape together.

More precisely, the main body 2 includes an optional first rectilinear portion 9a, a first circular portion 4a, a second optional rectilinear portion 9b, a second circular portion 4b, a third optional rectilinear portion 9c, a third circular portion 4c and a fourth optional rectilinear portion 9d.

The connection with the package and the printed circuit is respectively made through the first 3a and second 3b ends.

In addition, the main body 2 has preferentially a circular shaped cross-section. Advantageously, a circular shape has several advantages, and in particular an easy manufacture and allow cost; an easy calculation of the stiffness of the connector 1, either by approximate analytical formulae known to those skilled in the art, or by finite element type calculations; an easy optimisation of the dimensions (radius of the metal wire, radius of curvature of the circular portions 4a-4c, presence and length of the rectilinear portions 9a-9d, among other things) to obtain the desired stiffnesses, both in the directions parallel to the plane of the package and of the printed circuit and in the direction perpendicular to this plane, and to obtain the electrical and thermal resistances, as well as the desired impedances and electrical capacitances.

In reference to FIGS. 2A and 2B, a second exemplary embodiment of a connector 1 in accordance with the invention is represented, in a side view and a perspective view respectively.

In this second example, the main body 2 is a wire folded along two folding directions D1 and D2. It includes four circular portions 4a, 4b, 4c and 4d at least two of which define a wavy shape together.

The main body 2 is folded along two folding directions D1 and D2 so as to define an "S"-like shape.

More precisely, the main body 2 includes a first optional rectilinear portion 9a, a first circular portion 4a, a second optional rectilinear portion 9b, a second circular portion 4b, a third circular portion 4c, a third optional rectilinear portion 9c, a fourth circular portion 4d, and a fourth optional rectilinear portion 9d.

In reference to FIGS. 3A and 3B, a third exemplary embodiment of a connector 1 in accordance with the invention is represented in a side view and a perspective view respectively.

In this third example, the main body 2 is a wire folded along three folding directions D1, D2 and D3 so as to define a "Ω"-like shape with vertical ends. It includes four circular portions 4a, 4b, 4c and 4d at least two of which define a wavy shape together.

More precisely, the main body 2 includes a first optional rectilinear portion 9a, a first circular portion 4a, a second circular portion 4b, a second optional rectilinear portion 9b, a third circular portion 4c, a fourth circular portion 4d, and a third optional rectilinear portion 9c.

In reference to FIGS. 4A, 4B and 4C, a fourth exemplary embodiment of a connector 1 in accordance with the invention is represented in a side view, a perspective view and a top or bottom view respectively.

In this fourth example, the main body 2 is a wire folded along three folding directions D1, D2 and D3 in a similar way as the first example described previously in reference to FIG. 1A to 1C.

However, the connector 1 includes at each of the first 3a and second 3b ends of the main body 2 an approximately conical tip 5a and 5b having a circular connection area S.

Advantageously, the presence of such conical tips 5a and 5b can enable the periphery of the connection area S between the connector 1 and the package, and between the connector 1 and the printed circuit to be increased, and thus the mechanical reliability to be increased.

Such conical tips 5a and 5b can in particular be made by bar turning, punching or plastic local deformation of a wire.

Furthermore, a conical shape has several advantages, and in particular the increase in the attachment area making connection more reliable, and a moderate cost; an easy calculation of the stiffness of the connector 1, either by approximate analytical formulae known to those skilled in the art, or by finite element type calculations; an easy optimisation of the dimensions (radius of the metal wire, radius of curvature of the circular portions 4a-4c, presence and length of the rectilinear portions 9a, 9b, among other things) to obtain the desired stiffnesses, both in the directions parallel to the plane of the package and the printed circuit and in the direction perpendicular to this plane, and to obtain the electrical and thermal resistances, as well as the desired impedances and electrical capacitances below a threshold depending on the application.

For each of the first, second and third examples described above, each of the first 3a and second 3b ends of the main body 2 of the connector 1 has a circular connection area S, respectively for being connected to the microelectronic package and to the microelectronic support.

Figure 5B:
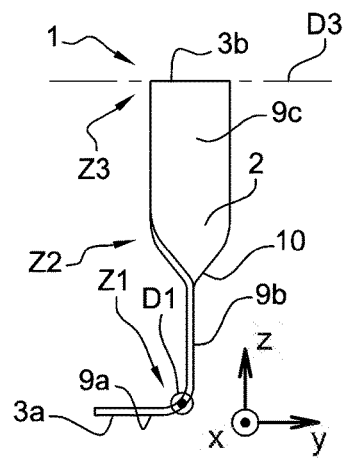
Figure 5C:
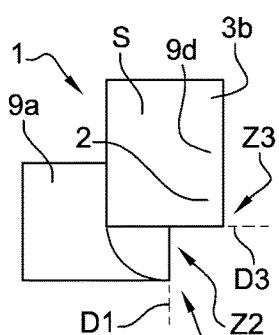

In reference to FIGS. 5A, 5B and 5C, a fifth exemplary embodiment of a connector 1 in accordance with the invention is represented in a perspective view, a side view and a top or bottom view respectively.

In this fifth example, the main body 2 is a strip folded along two folding directions D1 and D3.

More precisely, the main body 2 includes a first rectilinear portion 9a intended to, be brazed or soldered to the package or the printed circuit, which portion is called a "seat", a first circular portion 4a, a second optional rectilinear portion 9b, a twisted centre portion 10 where the main plane of the strip rotates for example by an angle in the order of 90°, a third optional rectilinear portion 9c, a second circular portion 4b, and a fourth optional rectilinear portion 9d intended to be brazed or soldered to the package or the printed circuit also called a "seat".

It is to be noted that it is frequently attempted to have the same stiffness in the two orthogonal directions of the plane of the package or the printed circuit. This is feasible within the scope of this fifth exemplary embodiment of the connector 1, because it is sufficient that both circular portions 4a and 4b have the same radius of curvature and that the two rectilinear portions 9b and 9c on either side of the twisted centre portion 10 have the same length.

On the contrary, when it is desired to have different stiffnesses in two directions orthogonal to the plane of the package or the printed circuit, it is sufficient to have both rectilinear portions 9b and 9c with different lengths. The stiffness mill then be lower in the direction orthogonal to the plane of the rectilinear portion 9b or 9c which is the longest.

Furthermore, the length of the seats (rectilinear portions 9a and 9d) can be optimised to have the best compromise between the bulk of the connector 1 and the length of the periphery of the seats (the greater this length, the more robust the braze or solder as indicated in the part relating to the state of prior art).

This fifth exemplary embodiment of the connector 1 according to the invention has several advantages, and in particular an easy manufacture and a low cost; an easy calculation of the stiffness of the connector 1 by finite element type calculations; an easy optimisation of the dimensions (length and thickness of the strip, radius of curvature of the circular portions 4a and 4b, presence and length of the rectilinear portions 9a-9d, height of the twisted centre portion 10, among other things) to obtain the desired stiffnesses, both in the directions parallel to the plane of the package and the printed circuit and in the direction perpendicular to this plane, and to obtain the electrical and thermal resistances, as well as the desired impedances and electrical capacitances below a threshold depending on the application. It is in particular easy to obtain with this example much lower stiffnesses in the directions parallel to the plane of the package or of the printed circuit than in the direction perpendicular to this plane.

Figure 6A:
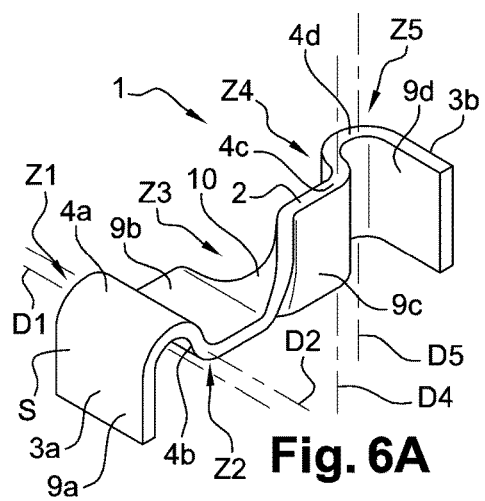
FIGS. 6A, 6B and 6C represent a perspective view, a side view and a top or bottom view respectively of a sixth exemplary embodiment of a connector in accordance with the invention.
Figure 6B:
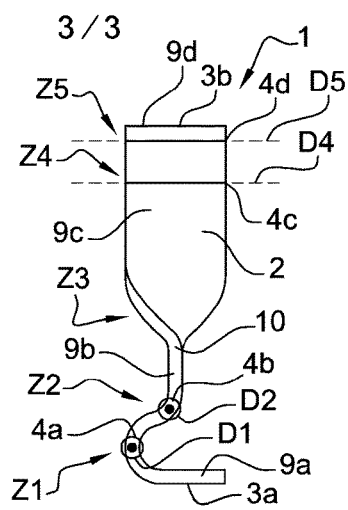
Figure 6C:
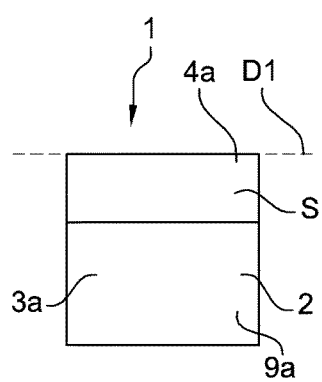

In reference to FIGS. 6A, 6B and 6C, a sixth exemplary embodiment of a connector 1 in accordance with the invention is represented in a perspective view, a side view and a top or bottom view respectively.

In this sixth example, the main body 2 is a strip folded along at least two folding directions D1 and D5.

More precisely, the main body 2 includes a first rectilinear portion 9a intended to be brazed or soldered to the package or the printed circuit which portion is called a "seat", a first half of circle circular portion 4a, a second quarter of circle circular portion 4b with a concavity opposed to that of the first circular portion 4a, a second optional rectilinear portion 9b, a twisted centre portion 10 where the main plane of the strip rotates for example by an angle in the order of 90°, a third optional rectilinear portion 9c, a third half of circle circular portion 4c, a fourth quarter of circle circular portion 4d with a concavity opposite to that of the third circular portion 4c, and a fourth optional rectilinear portion 9d intended to be brazed and soldered to the package or the printed circuit also called a "seat".

Advantageously, and unlike the fifth exemplary embodiment previously described, the lengths of the seats and the radiuses of curvature of the circular portions 4a-4d are adjusted with the strip width such that, when viewed in a top or bottom view, the projection of the connector 1 has a square shape.

It is also to be noted that it is frequently attempted to have the same stiffness in both orthogonal directions of the plane of the package or the printed circuit. This is feasible within the scope of this sixth exemplary embodiment of the connector 1, because it is sufficient that both circular portions 4a and 4d have the same radius of curvature and that both rectilinear portions 9b and 9c on either side of the twisted centre portion 10 have the same length.

On the contrary, when it is desired to have different stiffnesses in two directions orthogonal to the plane of the package or the printed circuit, it is sufficient to have the two rectilinear portions 9b and 9c with different lengths. The stiffness will then be lower in the orthogonal direction to the plane of the rectilinear portion 9b or 9c which is the longest.

Furthermore, the length of the seats (rectilinear portions 9a and 9d) can be optimised to have the best compromise between the bulk of the connector 1 and the length of the periphery of the seats.

This sixth exemplary embodiment of the connector 1 according to the invention has several advantages, and in particular an easy manufacture and a low cost; an easy calculation of the stiffness of the connector 1 by finite element type calculations; the possibility to obtain a square shape vertical projection facilitating the use and positioning of the connector 1; an easy optimisation of the dimensions (width and thickness of the strip, radius of curvature of the circular portions 4a-4d, presence and length of the rectilinear portions 9a-9d, height of the twisted centre portion 10, among other things) to have the desired stiffnesses, both in the directions parallel to the plane of the package and the printed circuit and in the direction perpendicular to this plane, and to obtain electrical and thermal resistances, as well as the desired impedances and electrical capacitances below a threshold depending on the application. It is in particular easy to obtain with this example much lower stiffnesses in the directions parallel to the plane of the package or the printed circuit than in the direction perpendicular to this plane.

On the other hand, in each of the fifth and sixth exemplary embodiments described above, each of the first 3a and second 3b ends of the main body 2 has for example a square connection area S.

Figure 7A:
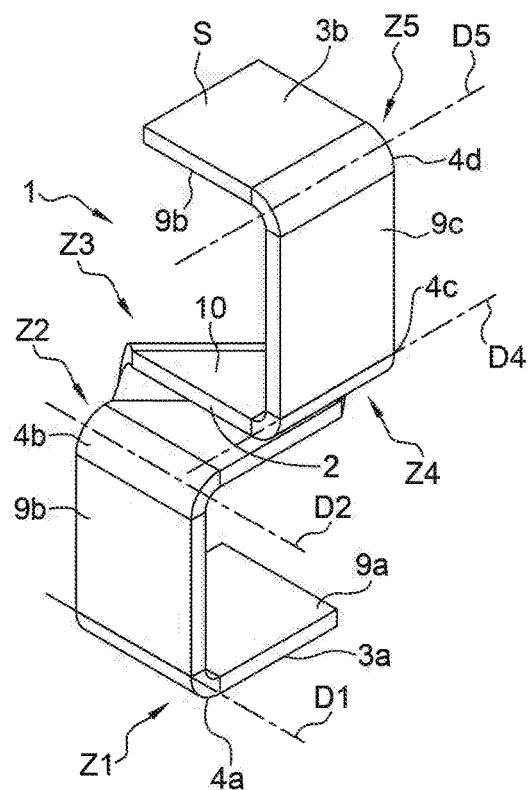
FIGS. 7A, 7B and 7C represent a perspective view, a side view and a top or bottom view respectively of a seventh exemplary embodiment of a connector in accordance with the invention.
Figure 7B:
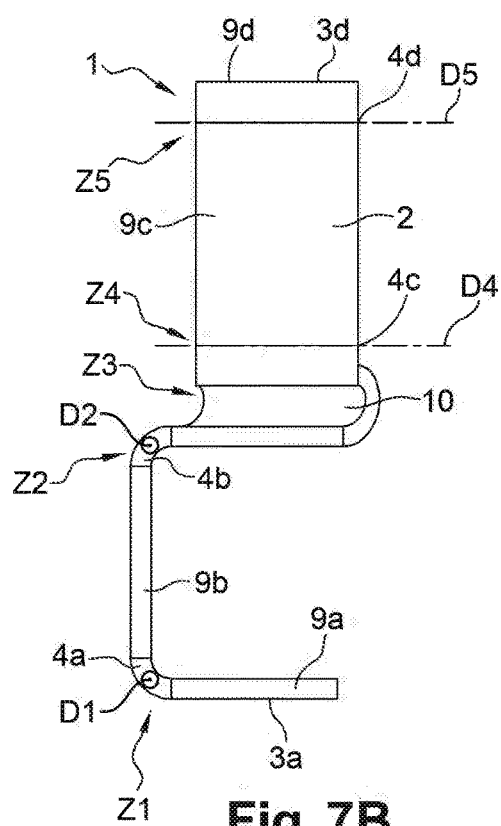
Figure 7C:
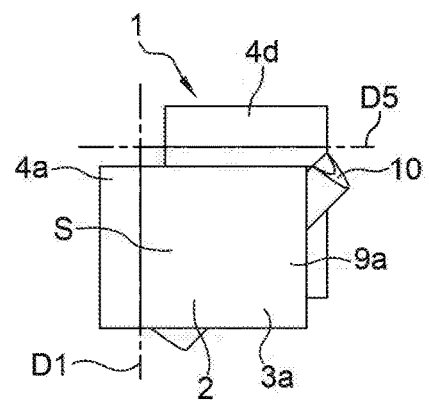

In reference to FIGS. 7A, 7B and 7C, a seventh exemplary embodiment of a connector 1 in accordance with the invention is represented, in a perspective view, a side view and a top or bottom view respectively.

In this seventh example, as in the sixth example described previously, the main body 2 is a strip folded along first D1 and second D2 folding directions at the first end 3a, and along third D4 and fourth D5 folding directions at the second end 3b, the first D1 and second D2 folding directions being parallel to each other and orthogonal to the third D3 and fourth D4 folding directions, the third D3 and fourth D4 folding directions being parallel to each other. In this way, what has been previously described for the sixth example is also applicable for the seventh example as regards these characteristics, and the references are analogous.

However, unlike the sixth example which provides that the centre part of the main body 2 is twisted at an angle in the order of 90°, the seventh example is characterised by the fact that the centre part 10 of the main body 2 is folded along a 45° direction from the first D1, second D2, third D3 and fourth D4 folding directions.

In reference to FIGS. 8A, 8B and 8C, an eighth exemplary embodiment of a connector 1 in accordance with the invention is represented in a side view, a top or bottom view and a perspective view respectively.

In this eighth example, the main body 2 is a metal sheet folded along two folding directions D1 and D2.

More precisely, the main body 2 includes cut-outs 6a, 6b formed between tabs 8 connecting the upper 7a and lower 7b parts, including the first 3a and second 3b ends respectively.

The metal sheet is machined, folded and deformed to obtain the connector 1. In particular, the connector 1 can be machined from a piece of stamped metal sheet in which the upper part 7a, called a "head", and lower part 7b, called a "foot", and the tabs 8, called "legs", connecting the head 7a and the foot 7b have been cut out. The legs 8 are provided substantially curved to decrease the vertical stiffness along the direction z of the connector 1. The sheet is then folded along two folding directions D1 and D2 of the folding zones Z1 and Z2.

Brazing or soldering can then be made on the head 7a and the foot 7b to connect the connector 1 to the package and to the printed circuit.

This eighth exemplary embodiment has several advantages, and in particular an easy manufacture and a low cost; an easy calculation of the stiffness of the connector 1 by finite element type calculations; an easy optimisation of the dimensions (dimensions of the head 7a and the foot 7b, length, width and curvature of the legs 8, among other things) to obtain the desired stiffnesses, both in the directions parallel to the plane of the package and the printed circuit and in the direction perpendicular to this plane, and to obtain the electrical and thermal resistances, as well as the desired impedances and electrical capacitances below a threshold depending on the application. It is in particular easy to obtain with this example very different stiffnesses in the directions parallel to the plane of the package or the printed circuit from those in the direction perpendicular to this plane.

Furthermore, according to this eighth exemplary embodiment of the connector 1, each of the first 3a and second 3b ends of the main body 2 has a connection area S having a "U"-like shape.

Advantageously, in all the exemplary connectors 1 previously described, the connectors 1, as a wire, a strip or a metal sheet, are elastic.

These connectors 1 can in particular be able to withstand without damage the lateral movements having relatively great amplitudes due to differential expansions between the package and the printed circuit.

In addition, the connectors 1 can enable to have mechanical stiffnesses in the three directions x, y and z which are adjustable by varying the dimensions and shape of the main body 2 of the connector 1. These adjustments can in particular use principles and methods known to those skilled in the art, and should be easily calculatable by mechanical calculation codes, and for example finite element methods.

Furthermore, the connectors 1 can ensure electrical, mechanical or thermal functions assigned thereto, by being able to quantify and to be relatively easily simulable by codes of electrical, mechanical or thermal calculations to have a reliable prediction of their electrical, mechanical or thermal performance.

On the other hand, these connectors 1 are discriminated from the columns, described previously in the part relating to the state of prior art, in particular in that they have an elastic and non-plastic behaviour, and a lower stiffness, in particular in the vertical direction z. Furthermore, the connectors 1 are discriminated from the springs developed by NASA, previously described in the part relating to the state of prior art, in particular in that they are less resistive, less inductive and less stiff.

It is also to be noted that, for the first, second and third examples described in reference to FIG. 1A to 3B, the connectors 1 as a metal wire are folded in a single vertical plane. As regards the fourth, fifth, sixth and seventh examples described in reference to FIG. 4A to 7C, the connectors 1 have the advantage of having a great connection area S for brazing or soldering.

Consequently, the invention can enable the calculation and adjustment of the stiffness of the connectors 1 to the desired value to be facilitated, for example by using a marketed code of mechanical calculation by finite elements, in the two directions of the plane of the package and of the printed circuit, and in the direction perpendicular to this plane. This is in particular important to compensate for the flatness or non-coplanarity defects of the package and of the printed circuit. These connectors 1 can for example be pre-positioned, for example using a grid array base-forming element 40 as described in the following, brazed or soldered to one of the ends 3a and 3b, and then brazed or soldered to the other of the ends 3a and 3b, while pressing on the package with some force. Thanks to the adjustable stiffnesses, these connectors 1 can act as a spring and correct non-flatness or non-coplanarity defects of the package and the printed circuit, with an easily estimable force as a function of the stiffness along the vertical direction z of the connectors 1 and on the non-flatness or non-coplanarity defects to be corrected.

On the other hand, as has been previously set forth, the invention has the major advantage of enabling the stiffness of the connector 1 to be calculated in the three directions x, y and z. The calculation method to this end can be conventional for those skilled in the art. It can for example consist in the succession of the following actions:

a) virtually building, using an appropriate software, the geometry of the connector 1, by properly connecting all its portions, b) meshing this geometry, fulfilling the usual meshing rules, in a meshing software or in a finite element mechanical calculation software, for example selected from the software from the ANSYS editor, the software package ABAQUS®, the software COMSOL Multiphysics®, the software CAST3M, among other things, c) imposing zero displacements in the three directions x, y and z on the nodes of the lower face of the connector 1, d) imposing an arbitrary displacement, for example by 50 μm, in one of the three directions x, y or z on the nodes of the upper face of the connector 1, the displacements in the two other directions being imposed to a zero value, e) solving the system, that is calculating the stress and deformations fields in the entire connector 1; this solving can be made preferably with the conventional so-called hypothesis of "large deformations", which amounts to activating geometrical non-linearities in the software, f) extracting from these stress fields, the force exerted onto the upper face of the connector 1, g) determining the stiffness in the direction considered as being the ratio of the force exerted to the upper face divided by the displacement imposed.

By repeating steps d) to g) of this procedure for the three possible directions x, y and z, the stiffnesses of the connector 1 can be obtained in these three directions.

Furthermore, as previously set forth, the object of the invention also relates to a microelectronic device, that can be the microelectronic package or the printed circuit, which includes a plurality of connectors according to the invention, and in particular such as those described in the seven previous examples. These connectors are intended to be disposed on a surface of the device, package or printed circuit, as a grid array 30 (see FIGS. 9A and 9B) to enable the package and the printed circuit to be connected as a grid array.

For positioning the connectors 1 as a grid array on the package or the printed circuit, a conventional solution known to those skilled in the art, through machines, is possible.

However, the invention also provides the use of a grid array base-forming element 40 in which a plurality of cavities 41 is formed according to the desired shape of the grid array 30 of the connectors 1, these cavities 41 accommodating the connectors 1 for being brazed or soldered to the package or the printed circuit.

Thus, FIGS. 9A and 9B represent two exemplary grid array base-forming elements 40 in a top view respectively.

The grid array base-forming element 40 preferentially includes a soluble material, preformed at the dimension of the package and in which the cavities 41 are made by being adapted to the dimensions of the connectors 1. The grid array of cavities 41, thus made in the water-soluble material, is designed to correspond to the grid array of the desired positions of the connectors 1.

The cavities 41 can have shapes particularly simple and easy to make, such as an elongate rectangular shape the two ends of which are rounded (see for example FIG. 1C in projection for the first example) or even a square shape (see for example FIG. 6C in projection for the sixth example).

The connectors 1, once they are positioned, are then brazed or soldered on one of the package or printed circuit, and then on the other of the package and the printed circuit.

In one alternative, the grid array base-forming element 40 can be removable. In this case, the grid array base-forming element 40 can be removed either after the first brazing or soldering, or after the second brazing or soldering.

Alternatively, when the grid array base-forming element 40 is not expected to be removable, it can remain in place during the life of the connectors 1. In this case, the grid array base-forming element 40 has also mechanical functions, that can for example retrieve at least partly the strains between the package and the printed circuit. It is however desirable to make sure that the heat expansion coefficient and the elasticity modulus of the grid array base-forming element 40 are adapted to those of the package and the printed circuit not to generate further stresses.

On the other hand, in the case where the stiffnesses of the connectors 1 in both directions x and y perpendicular to the plane of the package are different, as in the first, second, third, fourth and eighth examples of connectors 1 described previously, it can be desirable to have overall stiffnesses, that is the cumulative stiffness of all or part of the connectors 1, which are equivalent in the directions x and y. This can for example be achieved by positioning the connectors 1 partly in the direction x, and partly in the direction y. This alternate positioning in several directions can be greatly facilitated by the use of the grid array base-forming element 40, by making appropriately the cavities 41 in this element 40. FIGS. 9A and 9B represent possible positionings of connectors 1 as a grid array 30 the stiffnesses of which are different along the directions x and y.

A manufacturing principle of a connector 1 in accordance with the invention will now be described.

The manufacturing of such a connector 1 can be made from a wire, a strip or a plate, in particular a sheet, intended to be folded. The choice of the metal material used is important because it should be preferentially compatible with microelectronic processes, in particular the so-called "back end" processes, be electrically conductive, have a sufficiently high yield point to be able to withstand the side displacements caused by the differential expansions of the package and the printed circuit without however being too high to be able nevertheless to be folded readily. By way of examples, the metal material can be selected from copper, copper-beryllium alloys, brasses, or Kovar type alloys (iron Fe, nickel Ni, cobalt Co).

To be able to manufacture a connector 1 of the type described in reference to the eighth embodiment in connection with FIGS. 8A, 8B and 8C, the method includes the steps of machining a sheet or a coil by means of a press and a progressive die to cut it out (the cutting-out is made by shearing, a piece of the part remaining attached to the body of the sheet or coil), shaping by folding the sheet or coil, and performing a surface treatment of the sheet or coil to make it compatible for brazing or soldering. Finally, the connections can be detached by shearing.

On the other hand, FIG. 10 illustrates four steps a) to d) of a manufacturing method in accordance with the invention for making a connector 1 the main body 2 of which is a wire or a strip, that is for example a connector 1 according to the first six examples described before.

The method thus includes the following steps hereinafter of:

a) introducing a wire or strip coil 11 within a treatment machine 12, set such that it can fold the wire or strip along the plane selected, b) shaping by folding the wire or strip through the treatment machine 12, the wire or strip thereby undergoing after folding an automated dimensional control, c) cutting-out the wire or strip, d) performing an electrolytic or chemical surface treatment of the wire or strip to passivate it and make it compatible with brazing or soldering; for this, it is for example possible to conduct a nickel deposition of a 3 to 5 µm thickness, and a gold deposition of a 50 nm to 1 µm thickness.

In other words, in terms of dimensions of the connectors 1 according to the invention, there are several possibilities which depend essentially on the stiffnesses searched for these connectors 1. For example, for a connector 1 in the form of a folded wire of the type described for the first example in reference to FIGS. 1A, 1B and 1C, having a Young modulus in the order of 100 GPa (case of the brass for example), a diameter in the order of 300 µm, a total height in the order of 2.5 mm, a large radius of curvature (associated with the circular portion 4b) in the order of 500 µm, two small radiuses of curvature (associated with the circular portions 4a and 4c) in the order of 300 µm and two rectilinear portions 9a, 9d in the order of 0.1 mm, the vertical stiffness along z obtained is in the order of 91600 N/m and the stiffness in the horizontal plane (embedded-embedded) in the order of 25000 N/m.

Figure 11A:
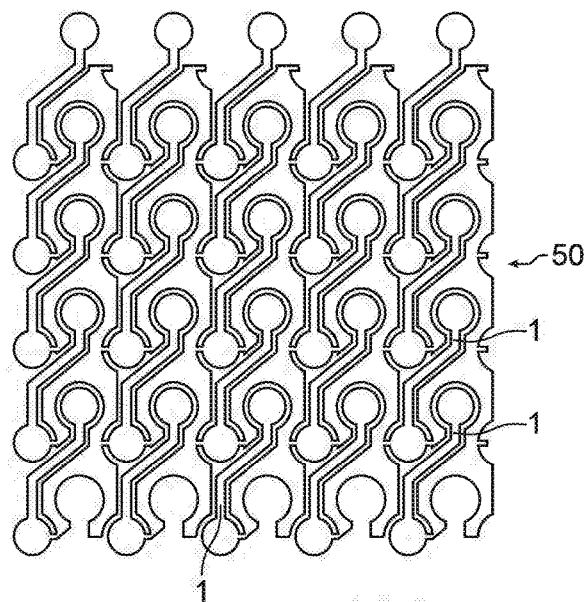
FIGS. 11A and 11B illustrate two other steps of a method for manufacturing a connector in accordance with the invention.
Figure 11C:
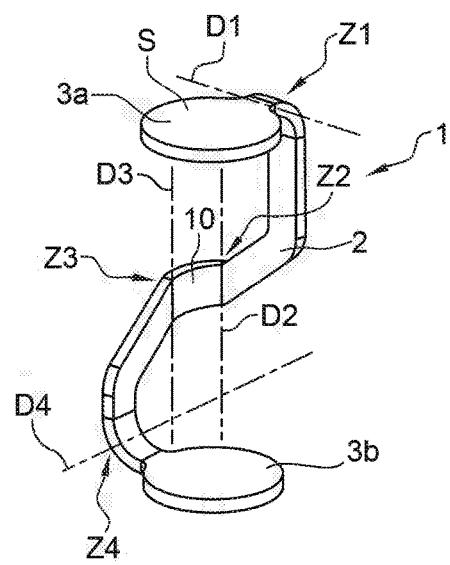
FIG. 11C represents a perspective view of a connector in accordance with the invention obtained by the manufacturing method of FIGS. 11A and 11B.
Figure 11B:
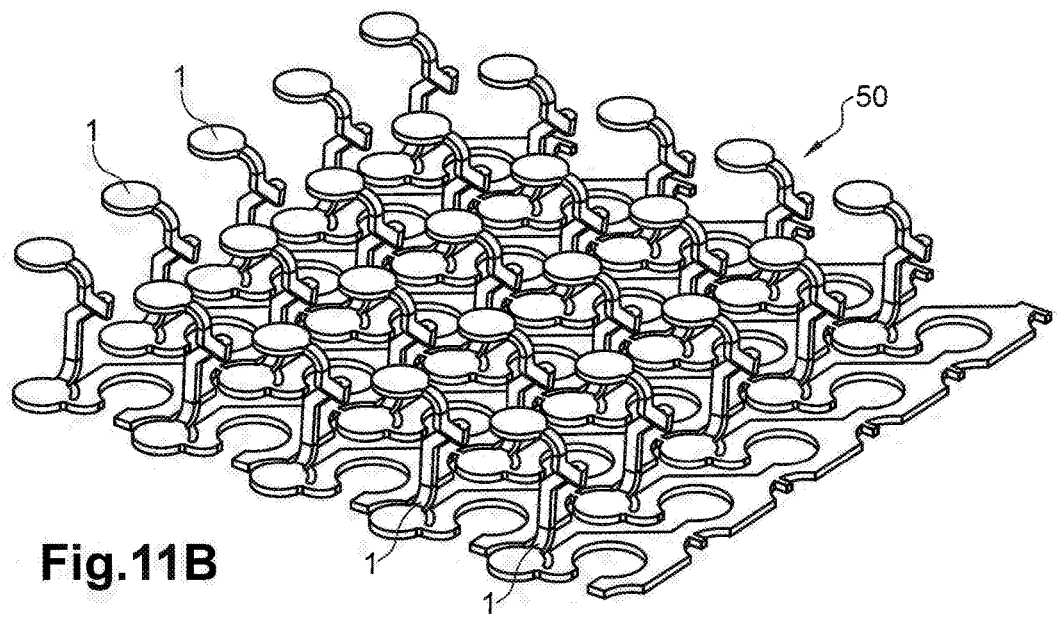

On the other hand, in reference to FIGS. 11A and 11B, two other steps of a method for manufacturing connectors 1 in accordance with the invention are illustrated.

More precisely, FIG. 11A represents a sheet 50, enabling connectors 1 to be manufactured, which sheet is cut-out before being folded, and FIG. 11B represents the sheet 50 cut-out after folding, the connectors 1 being still attached thereto.

Furthermore, FIG. 11C represents, in a perspective view, an exemplary connector 1 in accordance with the invention, detached from the sheet 50. The connector 1 is thus obtained from the sheet 50 by the implementation of operations of shaping by folding and cutting-out, optionally followed by a surface treatment for being subsequently attached to the connector 1, in particular by brazing or soldering.

As can be seen in this example, the connector 1 includes four folding directions D1, D2, D3 and D4, that is first D1 and fourth D4 folding directions, orthogonal to each other, respectively at the first 3a and second 3b ends, and second D2 and third D3 folding directions, parallel to each other and orthogonal to the first D1 and fourth D4 folding directions, at the centre part 10 of the main body 2. The second D2 and third D3 folding directions are made such that the main body 2 is folded by an angle of 90° at its centre part 10.

Furthermore, the first 3a and second 3b ends of the connector 1 have the form of a large-cross-section circular shape.

Of course, the invention is not limited to the exemplary embodiments just described. Various modifications can be made to these by those skilled in the art.

The phrase "including one" should be understood as being a synonym of "including at least one", unless otherwise specified.

The invention claimed is:

1. A device, comprising:
a plurality of electrical connectors, each configured to allow a connection between two electrical contacts facing a package and a support respectively, each electrical connector including a main body including a first end for being fixedly connected to the package and a second end for being fixedly connected to the support, the main body being folded along at least one folding zone;
the plurality of electrical connectors being disposed as a grid array or network on a surface of one of elements selected from the package and the support, the plurality of connectors enabling the grid array or network of the element to be connected with the other of the elements selected from the package and the support;
the plurality of electrical connectors including a general vertical direction orthogonal to the package and to the support, different connectors or groups of connectors among the plurality of connectors being disposed along the general vertical direction with different orientations at 90° relative to each other within the grid array or network; and
a grid array base-forming element in which a plurality of cavities is formed according to a desired shape of the grid array or network of the connectors, the plurality of cavities being formed with different orientations and accommodating the plurality of connectors.

2. The device according to claim 1, wherein the different connectors or groups of connectors among the plurality of connectors are disposed along the general vertical direction with alternate different orientations relative to each other within the grid array or network.

3. The device according to claim 1, wherein the at least one folding zone of each connector includes at least one folding direction.

4. The device according to claim 1, wherein the main body of each connector is elastic.

5. The device according to claim 1, wherein each of the first and second ends of the main body of each connector includes a connection area enlarged with respect to the main body, respectively for being connected to the package and to the support.

6. The device according to claim 1, wherein the main body of each connector includes a wire, a strip, or a plate.

7. The device according to claim 1, wherein the main body of each connector is folded along at least two folding directions.

8. The device according to claim 6, wherein the main body of each connector is a wire folded along two folding directions.

9. The device according to claim 6, wherein the main body of each connector is a wire folded along three folding directions.

10. The device according to claim 6, wherein the main body of each connector is a wire, and each of the first and second ends of the main body includes a conical tip having a circular connection area.

11. The device according to claim 6, wherein the main body of each connector is a strip, and each of the first and second ends of the main body has a rectangular or square connection area.

12. The device according to claim 6,
wherein the main body of each connector is a strip folded along a first folding direction at the first end and along a second folding direction at the second end, the first and second folding directions being orthogonal to each other, and
wherein a center part of the main body is twisted at an angle of about 90° or wherein the center part of the main body is folded along a 45° direction from the first and second folding directions.

13. The device according to claim 6,
wherein the main body of each connector is a strip folded along the first and second folding directions at the first end, and along the third and fourth folding directions at the second end, the first and second folding directions being parallel to each other and orthogonal to the third and fourth folding directions, the third and fourth folding directions being parallel to each other, and
wherein a center part of the main body is twisted at an angle of about 90° or wherein a center part of the main body is folded along a 45° direction from the first, second, third, and fourth folding directions.

14. The device according to claim 6, wherein the main body of each connector is a plate, and the plate includes cut-outs formed between tabs connecting upper and lower parts, including the first and second ends respectively.

15. The device according to claim 6, wherein the main body of each connector is a plate, and each of the first and second ends of the main body has a connection area of U-shape.

16. The device according to claim 1, wherein
the cavities accommodate the connectors such that the different connectors or groups of connectors are disposed along the general vertical direction with the different orientations at 90° relative to each other within the grid array or network, and
the cavities are configured to be attached to the device by brazing or soldering.

17. The device according to claim 16, wherein the grid array base-forming element is removable, and is configured to be withdrawn after the connectors have been attached to the package and/or the support by the brazing or the soldering.

18. A method for manufacturing a connector of a device that includes a plurality of electrical connectors, each configured to allow a connection between two electrical contacts facing a package and a support respectively, each electrical connector including a main body including a first end for being fixedly connected to the package and a second end for being fixedly connected to the support, the main body being folded along at least one folding zone; the plurality of electrical connectors being disposed as a grid array or network on a surface of one of elements selected from the package and the support, the plurality of connectors enabling the grid array or network of the element to be connected with the other of the elements selected from the package and the support; the plurality of electrical connectors including a general vertical direction orthogonal to the package and to the support, different connectors or groups of connectors among the plurality of connectors being disposed along the general vertical direction with different orientations at 90° relative to each other within the grid array or network; and a grid array base-forming element in which a plurality of cavities is formed according to a desired shape of the grid array or network of the connectors, the plurality of cavities being formed with different orientations, the method comprising:
from a conductive material conditioned as a sheet or coil, shaping by folding, cutting-out, and performing surface treating operations for attachment, by brazing or soldering, to obtain said each connector of the plurality of connectors.

19. The method according to claim 18, further comprising, successively or not:
introducing a wire or a strip coil within a treatment machine;
shaping by folding the wire or the strip coil through the treatment machine;
cutting-out the wire or the strip coil; and
performing a surface treatment of the wire or the strip coil.

20. The method according to claim 18, further comprising:
machining a sheet or a coil by a press and a progressive die to cut out the sheet or the coil;
shaping folding the sheet or the coil; and
performing a surface treatment of the sheet or the coil.

21. A device, comprising:
a plurality of electrical connectors, each configured to allow a connection between two electrical contacts facing a package and a support respectively, each electrical connector including a main body provided with a first end for being fixedly connected to the package and a second end for being fixedly connected to the support, the main body being folded along at least one folding zone;
the plurality of electrical connectors being disposed as a grid array or network on a surface of one of elements selected from the package and the support, the plurality of connectors enabling the grid array or network of the element to be connected with the other of the elements selected from the package and the support;
the plurality of electrical connectors including a general vertical direction orthogonal to the package and to the support, different connectors or groups of connectors among the plurality of connectors being disposed along the general vertical direction with alternate different orientations relative to each other within the grid array or network; and
a grid array base-forming element in which a plurality of cavities is formed according to a desired shape of the grid array or network of the connectors, the plurality of cavities being formed with different orientations.

* * * * *